United States Patent
Lin et al.

(10) Patent No.: US 8,502,717 B2
(45) Date of Patent: Aug. 6, 2013

(54) ANALOG-TO-DIGITAL CONVERTER, SOUND PROCESSING DEVICE, AND METHOD FOR ANALOG-TO-DIGITAL CONVERSION

(75) Inventors: Ching-Tzung Lin, Nantou (TW); Jui-Te Chiu, Hsinchu (TW); Yann-Ming Way, Sunnyvale, CA (US); Ming-Yung Shih, Hsinchu (TW); Kuo-Hsuan Chang, Taipei (TW)

(73) Assignee: Fortemedia, Inc., Sunnyvale, CA (US)

( * ) Notice: Subject to any disclaimer, the term of this patent is extended or adjusted under 35 U.S.C. 154(b) by 451 days.

(21) Appl. No.: 13/017,511

(22) Filed: Jan. 31, 2011

(65) Prior Publication Data
US 2012/0128181 A1    May 24, 2012

Related U.S. Application Data

(63) Continuation-in-part of application No. 12/950,021, filed on Nov. 19, 2010.

(51) Int. Cl.
*H03M 3/00* (2006.01)
(52) U.S. Cl.
USPC ............ 341/143; 341/155; 381/120; 381/122
(58) Field of Classification Search
USPC ..................... 341/143, 155; 381/120, 122
See application file for complete search history.

(56) References Cited

U.S. PATENT DOCUMENTS

| | | | |
|---|---|---|---|
| 6,339,647 B1 * | 1/2002 | Andersen et al. | 381/312 |
| 6,593,866 B1 * | 7/2003 | Eastty et al. | 341/143 |
| 7,205,918 B2 * | 4/2007 | Niederdrank et al. | 341/143 |
| 7,295,141 B1 | 11/2007 | Wu et al. | |
| 7,365,664 B2 * | 4/2008 | Caduff et al. | 341/139 |
| 7,385,540 B2 | 6/2008 | Wu et al. | |
| 2008/0285770 A1 | 11/2008 | Wu et al. | |

* cited by examiner

*Primary Examiner* — Khai M Nguyen
(74) *Attorney, Agent, or Firm* — McClure, Qualey & Rodack, LLP

(57) ABSTRACT

The invention provides a sound processing device. In one embodiment, the sound processing device comprises a first microphone, a first analog-to-digital converter, a second microphone, and a second analog-to-digital converter. The first microphone detects a first sound pressure to generate a first analog audio signal. The first analog-to-digital converter converts the first analog audio signal to a first digital audio signal. The second microphone detects a second sound pressure to generate a second analog audio signal. The second analog-to-digital converter converts the second analog audio signal to a second digital audio signal, encodes a third digital audio signal according to the second digital audio signal, receives the first digital audio signal and a clock signal, outputs data bits of the third digital audio signal when the clock signal oscillates to a logic low level, and outputs data bits of the first digital audio signal when the clock signal oscillates to a logic high level.

20 Claims, 8 Drawing Sheets

| Mode | CS | Type 1 | | Type 2 | | Type 3 | | Type 4 | |
|---|---|---|---|---|---|---|---|---|---|
| | | CLK Low | CLK High | CLK Low | CLK High | CLK Low | CLK High | CLK Low | CLK High |
| 0 | 0 | Sa" | Tri-state | Sa" | Tri-state | Sa" | Tri-state | Sa" | Tri-state |
| 0 | 1 | Tri-state | Sa" | Tri-state | Sa" | Tri-state | Sa" | Tri-state | Sa" |
| 1 | 0 | Sa" | -Sa" | Sa" | -Sa" | Sa" | -Sa" | Sa" | -Sa" |
| 1 | 1 | -Sa" | Sa" | -Sa" | Sa" | -Sa" | Sa" | -Sa" | Sa" |
| 1 | Toggle | Sa"+DC | Sb | Sa" x1.1 | Sb | Sa" | -Sb | Sa" delay | Sb |

FIG. 6

ANALOG-TO-DIGITAL CONVERTER, SOUND PROCESSING DEVICE, AND METHOD FOR ANALOG-TO-DIGITAL CONVERSION

CROSS REFERENCE TO RELATED APPLICATIONS

This application is a Continuation-In-Part of pending U.S. patent application Ser. No. 12/950,021, filed Nov. 19, 2010 and entitled "Analog-to-digital converter and analog-to-digital conversion method", the content of which is hereby incorporated by reference in its entirety.

BACKGROUND OF THE INVENTION

1. Field of the Invention

The invention relates to sound processing, and more particularly to analog-to-digital conversion.

2. Description of the Related Art

Referring to FIG. 1, a schematic diagram of a sound processing device 150 comprising a microphone array is shown. In one embodiment, the sound processing device 150 comprises a plurality of microphone sensors 151~15n, a plurality of the analog-to-digital converters (ADC) 161~16n, and a digital signal processor 170. The microphone sensors 151~15n detect sound pressure at different locations to generate a plurality of analog audio signals Ka~Kn. The analog-to-digital converters 161~16n respectively convert the analog audio signals Ka~Kn from analog-to-digital to obtain a plurality of digital audio signals Da~Dn. The digital signal processor 170 then receives the digital audio signals Da~Dn and processes the digital audio signals Da~Dn to generate an output audio signal I.

To convert the analog audio signals Ka~Kn to digital audio signals Da~Dn, the sound processing device 150 requires the analog-to-digital converters 161~16n as the circuit components thereof. If the analog-to-digital converters 161~16n have an efficient function design, the processing load of the digital signal processor 170 can be lowered. In addition, if the analog-to-digital converters 161~16n have a good output design, it can simplify the circuit integration between the output terminals of the analog-to-digital converters 161~16n and the input terminals of the digital signal processor 170. Thus, an analog-to-digital converter with an efficient design is required.

BRIEF SUMMARY OF THE INVENTION

The invention provides an analog-to-digital converter. In one embodiment, the analog-to-digital converter receives a first audio signal from a microphone sensor, receives a mode signal, a channel selection signal, and a clock signal, and comprises a toggle detection module, a pre-amplifier, 1-bit ΔΣ modulator, and a signal coding module. The toggle detection module determines whether the channel selection signal is toggling between a logic low level and a logic high level to generate a first control signal. The pre-amplifier amplifies the first audio signal to obtain a second audio signal. The 1-bit ΔΣ modulator converts the second audio signal from analog to digital to obtain a third audio signal. If the mode signal indicates an encoding mode and the channel selection signal is determined to be toggled, the signal coding module encodes a fourth audio signal according to the third audio signal, outputs data bits of the fourth audio signal when the clock signal oscillates to the logic low level, and outputs data bits of the channel selection signal when the clock signal oscillates to the logic high level.

The invention further provides a sound processing device. In one embodiment, the sound processing device comprises a first microphone, a first analog-to-digital converter, a second microphone, and a second analog-to-digital converter. The first microphone detects a first sound pressure to generate a first analog audio signal. The first analog-to-digital converter converts the first analog audio signal from analog to digital to obtain a first digital audio signal. The second microphone detects a second sound pressure to generate a second analog audio signal. The second analog-to-digital converter converts the second analog audio signal from analog to digital to obtain a second digital audio signal, encodes a third digital audio signal according to the second digital audio signal, receives the first digital audio signal and a clock signal, outputs data bits of the third digital audio signal when the clock signal oscillates to a logic low level, and outputs data bits of the first digital audio signal when the clock signal oscillates to a logic high level.

The invention further provides a method for analog-to-digital conversion. In one embodiment, an analog-to-digital converter comprises a toggle detection module, a pre-amplifier, a 1-bit ΔΣ modulator, and a signal coding module. First, a mode signal, a channel selection signal, and a clock signal are received. Whether the channel selection signal is toggling between a logic low level and a logic high level is then determined with the toggle detection module to generate a first control signal. A first audio signal is received from a microphone sensor. The first audio signal is then amplified with the pre-amplifier to obtain a second audio signal. The second audio signal is then converted from analog to digital with a 1-bit ΔΣ modulator to obtain a third audio signal. If the mode signal indicates an encoding mode and the channel selection signal is determined to be toggling, a fourth audio signal is encoded according to the third audio signal with the signal coding module, data bits of the fourth audio signal are outputted when the clock signal oscillates to the logic low level, and data bits of the channel selection signal are outputted when the clock signal oscillates to the logic high level.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 6 shows operations of a signal coding module corresponding to different input values of a mode signal and a channel selection signal according to the invention;

DETAILED DESCRIPTION OF THE INVENTION

Figure 1:
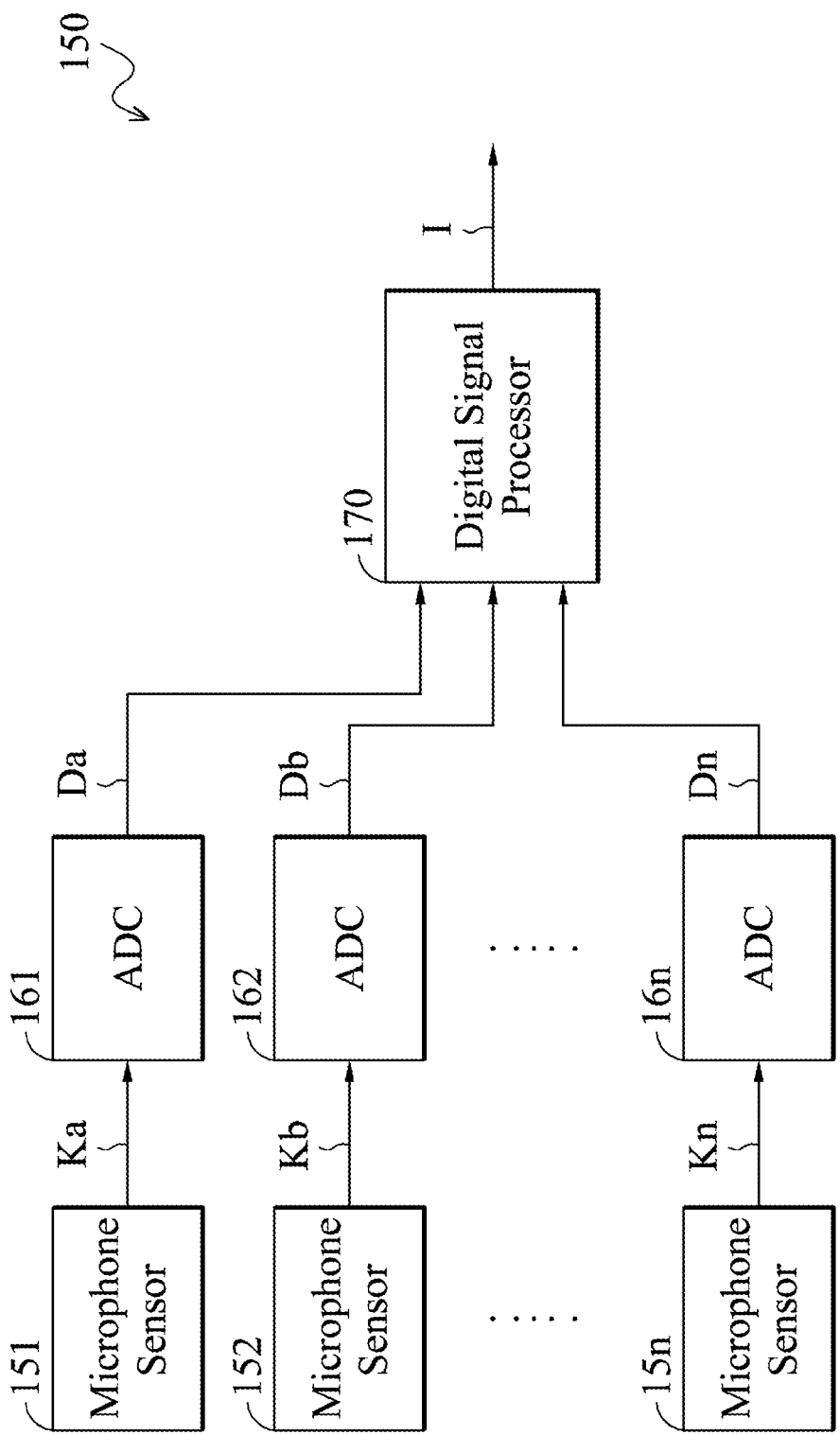
FIG. 1 is a schematic diagram of a sound processing device comprising a microphone array.
Figure 2:
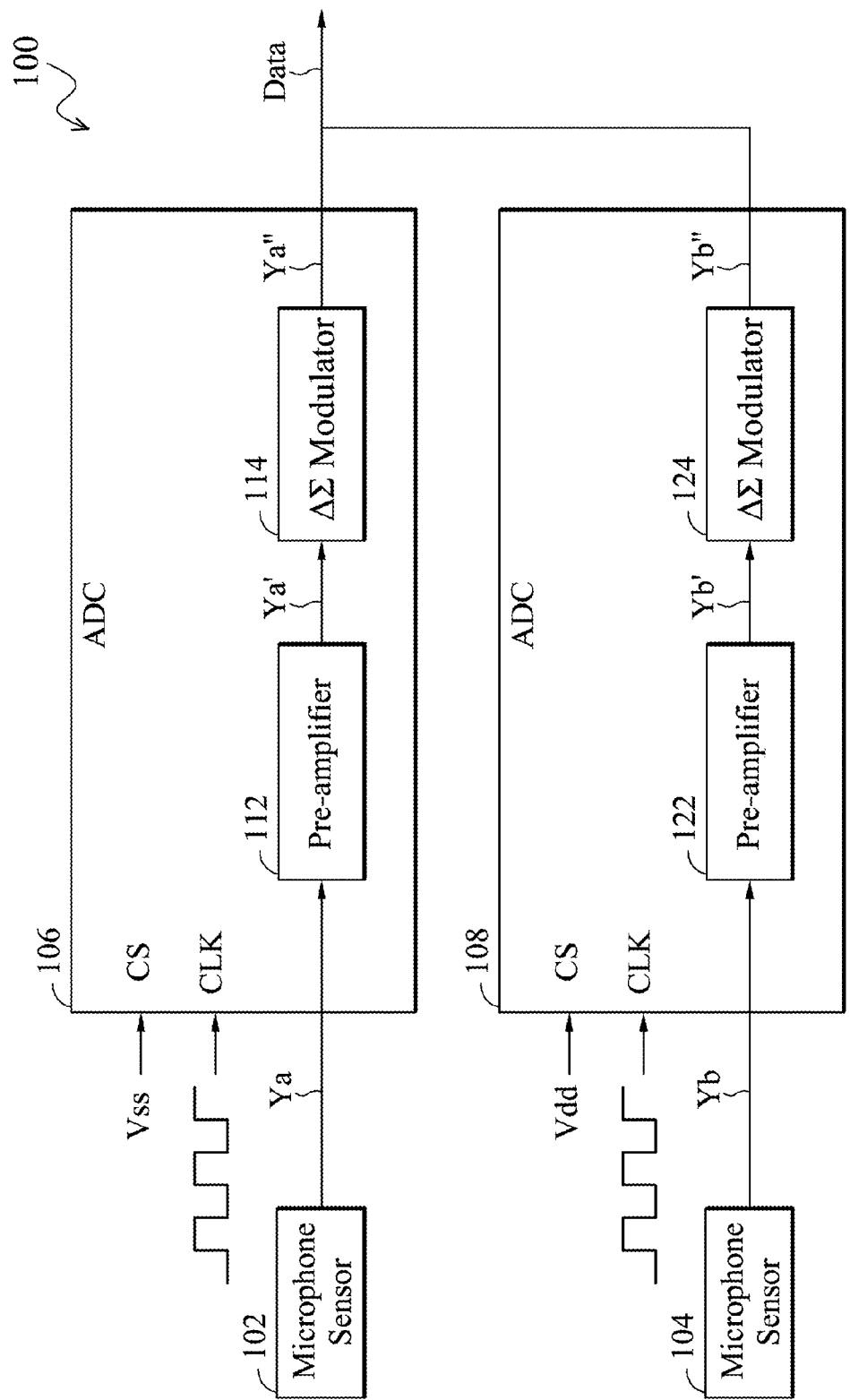
FIG. 2 is a schematic diagram of a sound processing device containing two microphones.

The following description is of the best-contemplated mode of carrying out the invention. This description is made for the purpose of illustrating the general principles of the invention and should not be taken in a limiting sense. The scope of the invention is best determined by reference to the appended claims.

Referring to FIG. 2, a schematic diagram of a sound processing device 100 containing two microphones 102 and 104 is shown. In addition to the microphones 102 and 104, the sound processing device 100 further comprises two analog-to-digital converters (ADC) 106 and 108. The microphone 102 detects a sound pressure to generate an analog audio signal Ya. The analog-to-digital converter 106 then converts the audio signal Ya from analog to digital to obtain a digital audio signal Ya". Similarly, the microphone 104 detects a sound pressure to generate an analog audio signal Yb. The analog-to-digital converter 108 then converts the audio signal Yb from analog to digital to obtain a digital audio signal Yb".

In one embodiment, the analog-to digital converter 106 comprises a pre-amplifier 112 and a delta-sigma ($\Delta\Sigma$) modulator 114. The pre-amplifier 112 amplifies the audio signal Ya to obtain an amplified audio signal Ya'. The $\Delta\Sigma$ modulator 114 converts the amplified audio signal Ya' from analog to digital to obtain the digital audio signal Ya". The analog-to-digital converter 114 further receives a channel selection signal CS and a clock signal CLK. The clock signal CLK oscillates between a logic low level and a logic high level. The channel selection signal CS of the analog-to-digital converter 106 is coupled to a ground voltage Vss. Thus, the analog-to-digital converter 106 outputs the data bits of the digital audio signal Ya" when the clock signal CLK oscillates to the logic low level.

Similarly, the analog-to digital converter 108 comprises a pre-amplifier 122 and a $\Delta\Sigma$ modulator 124. The pre-amplifier 122 amplifies the audio signal Yb to obtain an amplified audio signal Yb'. The $\Delta\Sigma$ modulator 124 converts the amplified audio signal Yb' from analog to digital to obtain the digital audio signal Yb". The analog-to-digital converter 124 also receives a channel selection signal CS and a clock signal CLK. The channel selection signal CS of the analog-to-digital converter 108 is coupled to a voltage source Vdd. Thus, the analog-to-digital converter 108 outputs the data bits of the digital audio signal Yb" when the clock signal CLK oscillates to the logic high level. Because the analog-to-digital converters 106 and 108 output the data bits of the audio signals Ya" and Yb" respectively during clock periods corresponding to the logic low level and the logic high level, the output data bits of the audio signals Ya" and Yb" are easily combined to obtain an output datastream.

Figure 3:
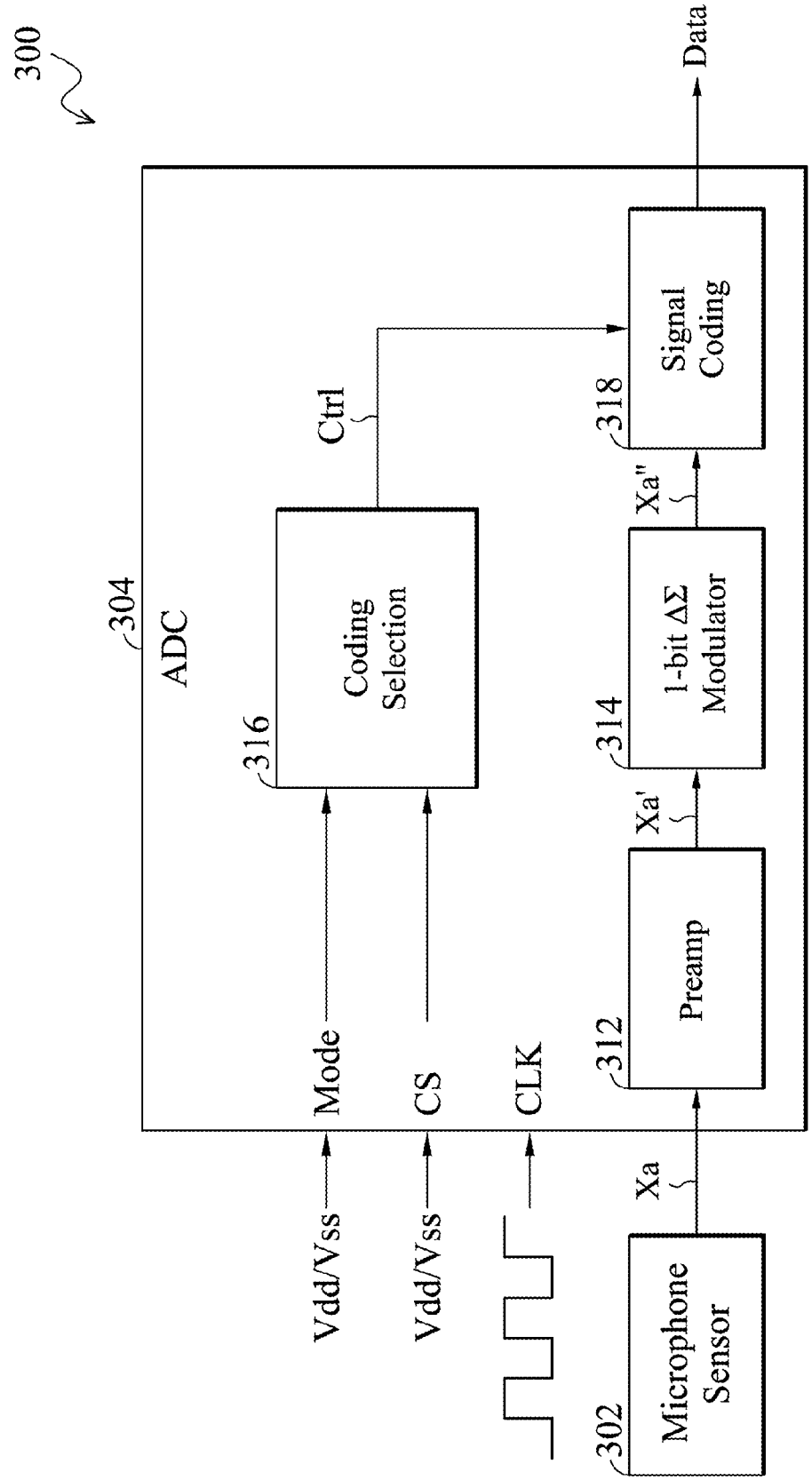
FIG. 3 is a block diagram of an analog-to-digital converter according to the invention.

Referring to FIG. 3, a block diagram of an analog-to-digital converter 304 according to the invention is shown. The analog-to-digital converter (ADC) 304 has four input terminals and an output terminal. Input terminals Mode and CS can be coupled to a voltage source Vdd or a ground voltage Vss. A mode signal and a channel selection signal CS are then respectively obtained via the input terminals Mode and CS. When the input terminal Mode is coupled to the voltage source Vdd, the mode signal is at a logic high level to indicate that an encoding mode has been selected. When the input terminal Mode is coupled to the ground voltage Vss, the mode signal is at a logic low level to indicate that the encoding mode has not been selected. An input terminal CLK receives a clock signal which periodically oscillates between a logic high level and a logic low level. A microphone sensor 302 detects a sound pressure to generate an analog audio signal Xa. The analog-to-digital converter 304 then receives the audio signal Xa from the microphone sensor 302 and processes the analog audio signal Xa according to the mode signal to generate a digital audio signal. The analog-to-digital converter 304 then outputs data of the digital audio signal according to the channel selection signal CS and the clock signal via an output terminal.

In one embodiment, the analog-to-digital converter 304 comprises a pre-amplifier 312, a 1-bit $\Delta\Sigma$ modulator 314, a signal coding module 318, and a coding selection module 316. The pre-amplifier 312 amplifies the analog audio signal Xa to obtain an amplified audio signal Xa'. The 1-bit $\Delta\Sigma$ modulator 314 then converts the amplified audio signal Xa' from analog to digital to obtain a digital audio signal Xa". The coding selection module 316 receives the mode signal and the channel selection signal CS and then generates a control signal Ctrl according to the mode signal and the channel selection signal CS. The control signal Ctrl is then sent to the signal coding module 318. When the control signal Ctrl indicates that the encoding mode has been selected, the signal coding module 318 encodes a coded audio signal according to the digital audio signal Xa" as an output signal of the analog-to-digital converter 304. When the control signal Ctrl indicates that the encoding mode has not been selected, the signal coding module 318 directly forwards the digital audio signal Xa" generated by the 1-bit $\Delta\Sigma$ modulator 314 as an output signal of the analog-to-digital converter 304.

The channel selection signal CS determines a format of the output signal of the analog-to-digital converter 304. When the input terminal CS is coupled to a ground voltage Vss, the channel selection signal CS is at a logic low level. The analog-to-digital converter 304 then outputs data bits of the output signal when the clock signal oscillates to a logic low level, and does not output data bits of the output signal when the clock signal oscillates to a logic high level. In other words, the output terminal of the analog-to-digital converter 304 is switched to a high-impedance state (Z shown in FIG. 4) when the clock signal oscillates to a logic high level. When the input terminal CS is coupled to a voltage source Vdd, the channel selection signal CS is at a logic high level. The analog-to-digital converter 304 then outputs data bits of the output signal when the clock signal oscillates to a logic high level, and does not output data bits of the output signal when the clock signal oscillates to a logic low level. In other words, the output terminal of the analog-to-digital converter 304 is switched to a high-impedance state (Z shown in FIG. 4) when the clock signal oscillates to a logic low level.

Figure 4:
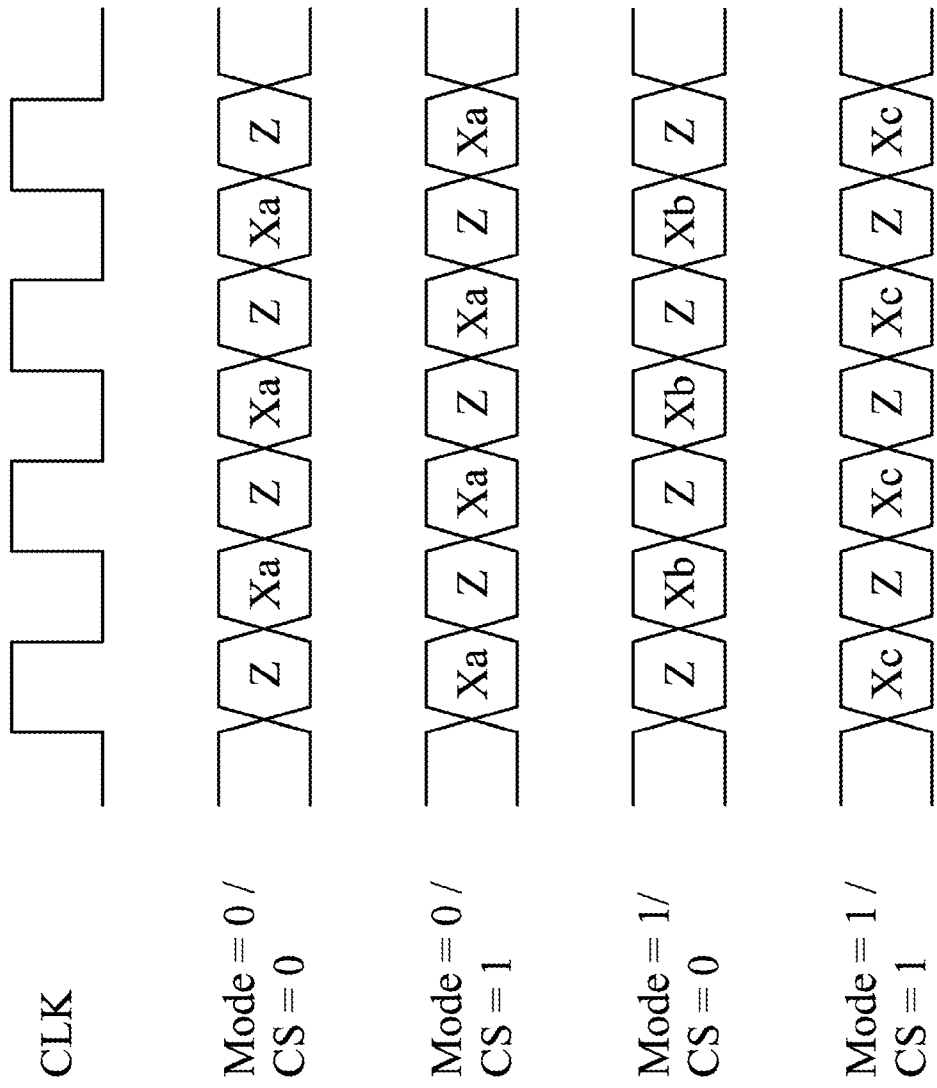
FIG. 4 is a data format diagram of an output signal of an analog-to-digital converter according to the invention.

Referring to FIG. 4, a data format diagram of an output signal of the analog-to-digital converter 304 according to the invention is shown. When the mode signal is at a logic low level, an encoding mode is not selected, and the digital audio signal Xa" generated by the 1-bit $\Delta\Sigma$ modulator 314 is directly taken as an output signal of the analog-to-digital converter 304 without encoding. If the channel selection signal CS is at a logic low level, the analog-to-digital converter 304 outputs data bits of the digital audio signal Xa" when the clock signal is at the logic low level. If the channel selection signal CS is at a logic high level, the analog-to-digital converter 304 outputs data bits of the digital audio signal Xa" when the clock signal is at the logic high level. When the mode signal is at a logic high level, the encoding mode has been selected, and the signal coding module 318 encodes a coded audio signal Xb or Xc as an output signal of the analog-to-digital converter 304. If the channel selection signal CS is at a logic low level, the analog-to-digital converter 304 outputs data bits of the coded audio signal Xb when the clock signal is at the logic low level. If the channel selection signal CS is at a logic high level, the analog-to-digital converter 304 outputs data bits of the coded audio signal Xc when the clock signal is at the logic high level. The signal coding module 318 performs different encoding processes to encode different coded audio signals Xb and Xc when the channel selection signal CS is at different levels.

The signal coding module 318 performs an encoding process in a variety of ways comprising offset adjustment, gain adjustment, phase adjustment, and delay adjustment. In one embodiment, the signal coding module 318 adds a positive offset value to the digital audio signal Xa" to obtain the coded audio signal if the channel selection signal CS is at a logic low level, and the signal coding module 318 adds a negative offset value to the digital audio signal Xa" to obtain the coded audio signal if the channel selection signal CS is at a logic high level. In another embodiment, the signal coding module 318 multiplies the digital audio signal Xa" by a first multiplier to obtain the coded audio signal if the channel selection signal CS is at a logic low level, and the signal coding module 318 multiplies the digital audio signal Xa" by a second multiplier to obtain the coded audio signal if the channel selection signal CS is at a logic high level, wherein the first multiplier is greater than 1 and the second multiplier is smaller than 1.

In another embodiment, the signal coding module 318 does not alter the phase of the digital audio signal Xa" if the channel selection signal CS is at a logic low level, and the signal coding module 318 inverts the phase of the digital audio signal Xa" to obtain the coded audio signal if the channel selection signal CS is at a logic high level. In another embodiment, the signal coding module 314 delays the digital audio signal Xa" to obtain the coded audio signal if the channel selection signal CS is at a logic low level, and the signal coding module 314 does not delay the digital audio signal Xa" if the channel selection signal CS is at a logic high level.

Figure 5:
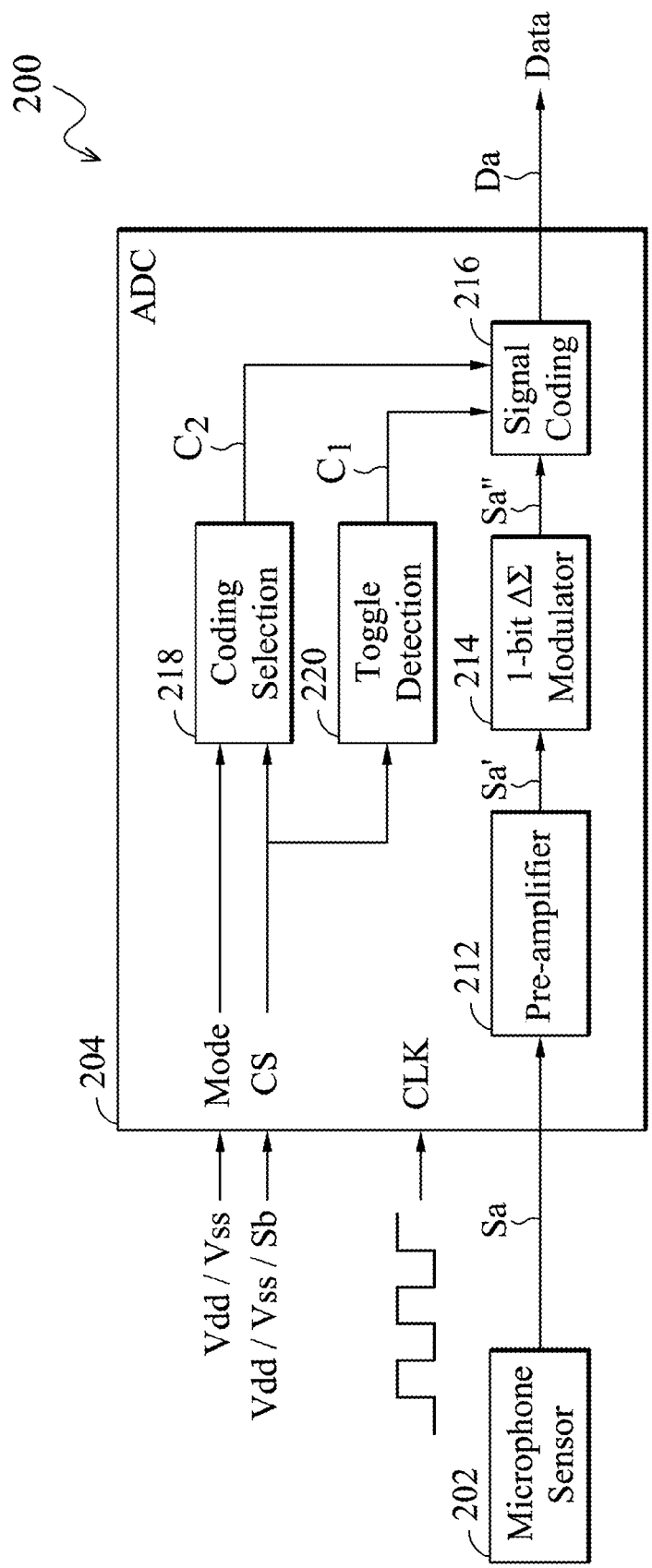
FIG. 5 is a block diagram of an analog-to-digital converter according to the invention.

Referring to FIG. 5, a block diagram of an analog-to-digital converter 204 according to the invention is shown. The analog-to-digital converter 204 receives an analog audio signal from a microphone 202, and outputs a digital audio signal Da. The analog-to-digital converter 204 also receives a mode signal, a channel selection signal CS, and a clock signal CLK. The mode signal indicates whether an encoding mode has been selected. When the encoding mode has been selected, the input terminal of the mode signal is coupled to a voltage source Vdd, and the mode signal stays at a logic high level. Otherwise, the input terminal of the mode signal is coupled to a ground voltage Vss, and the mode signal stays at a logic low level. The input terminal of the channel selection signal CS may be coupled to a voltage source Vdd, a ground voltage Vss, or used to receive a digital audio signal Sb. The clock signal CLK oscillates between a logic high level and a logic low level.

In one embodiment, the analog-to-digital converter 204 comprises a pre-amplifier 212, a 1-bit delta sigma (ΔΣ) modulator 214, a signal coding module 216, a toggle detection module 220, and a coding selection module 218. The pre-amplifier 212 amplifies the audio signal Sa to obtain an amplified audio signal Sa'. The 1-bit ΔΣ modulator 214 then converts the amplified audio signal Sa' from analog to digital to obtain a digital audio signal Sa". The operation of the signal coding module 216 is controlled by the control signals $C_1$ and $C_2$. The coding selection module 218 receives the mode signal and the channel selection signal CS and generates the control signal $C_2$ according to the mode signal and the channel selection signal CS. The toggle detection signal 220 determines whether the channel selection signal CS is toggling between a logic low level and a logic high level to generate the control signal $C_1$. If the voltage of the channel selection signal CS switches between the logic low level and the logic high level at a frequency higher than a threshold, the toggle detection module 220 determines that the channel selection signal Cs is toggling. Thus, when the channel selection input terminal is coupled to the voltage source Vdd or the ground voltage Vss, the channel selection signal CS stays at the logic high level or the logic low level, and the toggle detection module 220 determines that the channel selection signal CS is not toggling. When the channel selection signal CS is a received digital audio signal Sb rather than the logic low level of the ground voltage Vss or the logic high level of the voltage source Vdd, the channel selection signal CS changes between the logic low level and the logic high level with the bit values thereof, and the toggle detection module 220 determines that the channel selection signal CS is toggling.

Referring to FIG. 6, a table of operations of the signal coding module 216 corresponding to different input values of the mode signal and the channel selection signal according to the invention is shown. When the mode signal is at a logic low level, an encoding mode is not selected. If the channel selection signal is at a logic low level, the signal coding module 216 directly outputs data bits of the digital audio signal Sa" generated by the 1-bit ΔΣ modulator 214 when the clock signal CLK oscillates to the logic low level, and the output terminal of the analog-to-digital converter 204 is switched to a high impedance state (tri-state) when the clock signal CLK oscillates to the logic high level. If the channel selection signal is at a logic high level, the signal coding module 216 directly outputs data bits of the digital audio signal Sa" generated by the 1-bit ΔΣ modulator 214 when the clock signal CLK oscillates to the logic high level, and the output terminal of the analog-to-digital converter 204 is switched to the high impedance state when the clock signal CLK oscillates to the logic low level.

When the mode signal is at a logic high level, an encoding mode is selected. If the channel selection signal is at a logic low level, the signal coding module 216 directly outputs data bits of the digital audio signal Sa" generated by the 1-bit ΔΣ modulator 214 when the clock signal CLK oscillates to the logic low level, and outputs inverted data bits of the digital audio signal Sa" when the clock signal CLK oscillates to the logic high level. If the channel selection signal is at the logic high level, the signal coding module 216 directly outputs data bits of the digital audio signal Sa" generated by the 1-bit ΔΣ modulator 214 when the clock signal CLK oscillates to the logic high level, and outputs inverted data bits of the digital audio signal Sa" when the clock signal CLK oscillates to the logic low level.

When the mode signal is at a logic high level to indicate that the encoding mode has been selected, and the channel selection signal is toggling between the logic low level and the logic high level, the channel selection signal is a digital audio signal Sb received from another circuit component. The signal coding module 216 then encodes a coded audio signal according to the digital audio signal Sa" generated by the 1-bit ΔΣ modulator 214. The signal coding module 216 may encode the coded audio signal in a variety of ways. For example, the signal coding module 216 may add a DC offset value to the digital audio signal Sa" to obtain the coded audio signal, multiply the digital audio signal Sa" by a multiplier to obtain the coded audio signal, or delay the digital audio signal Sa" by a delay period to obtain the coded audio signal. When the clock signal CLK oscillates to the logic low level, the signal coding module 216 outputs data bits of the coded audio signal. When the clock signal CLK oscillates to the logic high level, the signal coding module 216 outputs data bits of the channel selection signal Sb.

Figure 7:
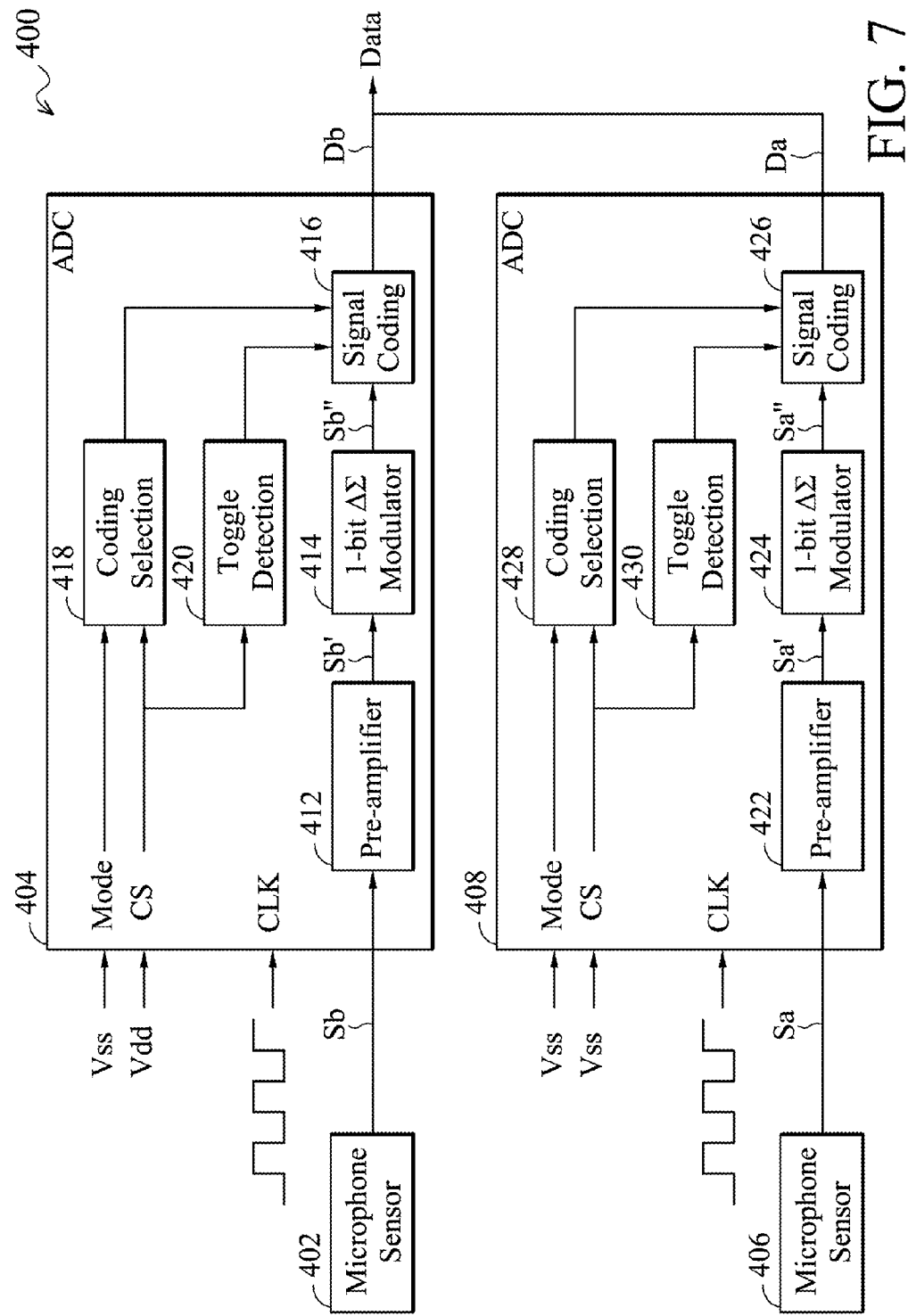
FIG. 7 is a block diagram of an embodiment of a sound processing device according to the invention.

Referring to FIG. 7, a block diagram of an embodiment of a sound processing device 400 according to the invention is shown. In one embodiment, the sound processing device 400 comprises two microphones 402 and 406 and two analog-to-digital converters 404 and 408. The analog-to-digital converters 404 and 408 have the same circuit structure as that of the analog-to-digital converter 204 shown in FIG. 5. In addition, the analog-to-digital converters 404 and 408 are coupled in parallel. The microphone 402 detects a sound pressure to generate an audio signal Sb. A pre-amplifier 412 and a ΔΣ modulator 414 of the analog-to-digital converter 404 converts the analog audio signal Sb to a digital audio signal Sb". An input terminal of a mode signal of the analog-to-digital converter 404 is coupled to a logic low level of a ground voltage Vss, and an input terminal of a channel selection signal CS of the analog-to-digital converter 404 is coupled to a logic high level of a voltage source Vdd. A signal coding module 416 of the analog-to-digital converter 404 therefore outputs the data bits of the digital audio signal Sb" as an output signal Db when the clock signal CLK oscillates to a logic high level, and does not output data when the clock signal CLK oscillates to a logic low level. The output terminal of the analog-to-digital converter 404 is switched to a high impedance state when the clock signal CLK oscillates to a logic low level.

The microphone 406 detects a sound pressure to generate an analog audio signal Sa. A pre-amplifier 422 and a ΔΣ modulator 424 of the analog-to-digital converter 408 converts the analog audio signal Sa to a digital audio signal Sa". An input terminal of a mode signal of the analog-to-digital converter 408 is coupled to a logic low level of a ground voltage Vss, and an input terminal of a channel selection signal of the analog-to-digital converter 408 is coupled to a logic low level of a ground voltage Vss. A signal coding module 426 of the analog-to-digital converter 408 therefore outputs the data bits of the digital audio signal Sa" as an output signal Da when the clock signal CLK oscillates to a logic low level, and does not output data when the clock signal CLK oscillates to a logic high level. The output terminal of the analog-to-digital converter 408 is switched to a high impedance state when the clock signal CLK oscillates to a logic high level. The data bits of output signals Sa and Sb of the analog-to-digital converters 404 and 408 are then combined to form an output datastream of the sound processing device 400.

Figure 8:
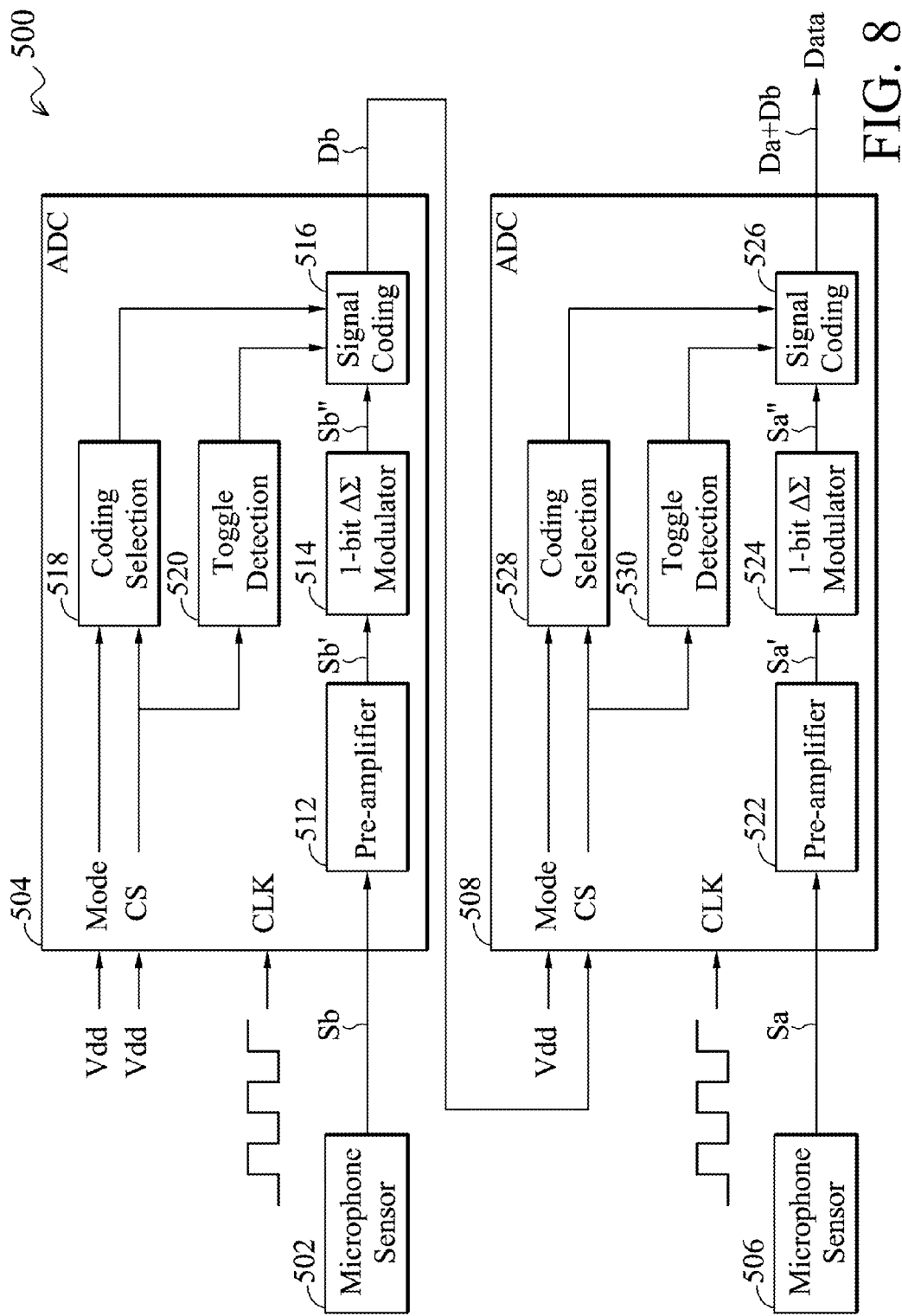
FIG. 8 is a block diagram of another embodiment of a sound processing device according to the invention.

Referring to FIG. 8, a block diagram of another embodiment of a sound processing device 500 according to the invention is shown. In one embodiment, the sound processing device 500 comprises two microphones 502 and 506 and two analog-to-digital converters 504 and 508. The analog-to-digital converters 504 and 508 have the same circuit structure as that of the analog-to-digital converter 204 shown in FIG. 5. In addition, the analog-to-digital converters 504 and 508 are coupled in series. The microphone 502 detects a sound pressure to generate an analog audio signal Sb. A pre-amplifier 512 and a ΔΣ modulator 514 of the analog-to-digital converter 504 converts the analog audio signal Sb to a digital audio signal Sb". Input terminals of a mode signal and a channel selection signal of the analog-to-digital converter 504 are both coupled to a logic high level of a voltage source Vdd. A signal coding module 516 of the analog-to-digital converter 504 therefore outputs the data bits of the digital audio signal Sb" as an output signal Db when the clock signal CLK oscillates to a logic high level, and outputs inverted data bits of the digital audio signal Sb" as the output signal Db when the clock signal CLK oscillates to a logic low level.

The microphone 506 detects a sound pressure to generate an analog audio signal Sa. A pre-amplifier 522 and a ΔΣ modulator 524 of the analog-to-digital converter 508 converts the analog audio signal Sa to a digital audio signal Sa". An input terminal of a mode signal of the analog-to-digital converter 508 is coupled to a logic high level of a voltage source Vdd, and the analog-to-digital converter 508 receives the output signal Db of the analog-to-digital converter 504 as a channel selection signal thereof. A toggle detection module 530 of the analog-to-digital converter 508 therefore determines that the output signal Db is toggling between the logic low level and the logic high level. A signal coding module 526 of the analog-to-digital converter 508 therefore encodes a coded audio signal Da according to the digital audio signal Sa", outputs the data bits of the coded audio signal Da as an output signal when the clock signal CLK oscillates to a logic low level, and outputs data bits of the signal Db generated by the analog-to-digital converter 504 as the output signal when the clock signal CLK oscillates to a logic high level. In other words, the output signal of the analog-to-digital converter 508 comprises the data bits of digital audio signals Da and Db respectively derived from analog audio signals Sa and Sb. The output signal (Da+Db) of the analog-to-digital converters 508 is then taken as an output datastream of the sound processing device 500.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog-to-digital converter, receiving a first audio signal from a microphone sensor, receiving a mode signal, a channel selection signal, and a clock signal, comprising:
    a toggle detection module, determining whether the channel selection signal is toggling between a logic low level and a logic high level to generate a first control signal;
    a pre-amplifier, amplifying the first audio signal to obtain a second audio signal;
    a 1-bit ΔΣ modulator, converting the second audio signal from analog to digital to obtain a third audio signal; and
    a signal coding module, if the mode signal indicates an encoding mode and the channel selection signal is determined to be toggling, encoding a fourth audio signal according to the third audio signal, outputting data bits of the fourth audio signal when the clock signal oscillates to the logic low level, and outputting data bits of the channel selection signal when the clock signal oscillates to the logic high level.

2. The analog-to-digital converter as claimed in claim 1, wherein the analog-to-digital converter further comprises:
    a coding selection module, receiving the mode signal and the channel selection signal, and generating a second control signal according to the mode signal and the channel selection signal,
    wherein the second control signal is sent to the signal coding module.

3. The analog-to-digital converter as claimed in claim 1, wherein if the mode signal does not indicate the encoding mode and the channel selection signal stays at the logic low level, the signal coding module outputs data bits of the third audio signal when the clock signal oscillates to the logic low level, and the output terminal of the analog-to-digital converter is switched to a high-impedance state when the clock signal oscillates to the logic high level.

4. The analog-to-digital converter as claimed in claim 3, wherein if the mode signal does not indicate the encoding mode and the channel selection signal stays at the logic high level, the signal coding module outputs data bits of the third audio signal when the clock signal oscillates to the logic high level, and the output terminal of the analog-to-digital converter is switched to the high-impedance state when the clock signal oscillates to the logic low level.

5. The analog-to-digital converter as claimed in claim 1, wherein if the mode signal indicates the encoding mode and the channel selection signal stays at the logic low level, the signal coding module outputs data bits of the third audio signal when the clock signal oscillates to the logic low level, and outputs inverted data bits of the third audio signal when the clock signal oscillates to the logic high level.

6. The analog-to-digital converter as claimed in claim 5, wherein if the mode signal indicates the encoding mode and the channel selection signal stays at the logic high level, the signal coding module outputs data bits of the third audio signal when the clock signal oscillates to the logic high level, and outputs inverted data bits of the third audio signal when the clock signal oscillates to the logic low level.

7. The analog-to-digital converter as claimed in claim 1, wherein the signal coding module generates the fourth audio signal by adding a DC offset value to the third audio signal.

8. The analog-to-digital converter as claimed in claim 1, wherein the signal coding module generates the fourth audio signal by multiplying the third audio signal by a multiplier.

9. The analog-to-digital converter as claimed in claim 1, wherein the signal coding module generates the fourth audio signal by delaying the third audio signal by a delay period.

10. A sound processing device, comprising:
a first microphone, detecting a first sound pressure to generate a first analog audio signal;
a first analog-to-digital converter, converting the first analog audio signal from analog to digital to obtain a first digital audio signal;
a second microphone, detecting a second sound pressure to generate a second analog audio signal; and
a second analog-to-digital converter, converting the second analog audio signal from analog to digital to obtain a second digital audio signal, encoding a third digital audio signal according to the second digital audio signal, receiving the first digital audio signal and a clock signal, outputting data bits of the third digital audio signal when the clock signal oscillates to a logic low level, and outputting data bits of the first digital audio signal when the clock signal oscillates to a logic high level.

11. The sound processing device as claimed in claim 10, wherein the second analog-to-digital converter comprises:
a pre-amplifier, amplifying the second analog audio signal to obtain a third analog audio signal;
a 1-bit ΔΣ modulator, converting the third analog audio signal from analog to digital to obtain the second digital audio signal; and
a signal coding module, when a control signal indicates that the first digital audio signal is determined to be toggling, encoding the third digital outputting data bits of the third digital audio signal when the clock signal oscillates to the logic low level.

12. The sound processing device as claimed in claim 11, wherein the second analog-to-digital converter further comprises:
a toggle detection module, determining whether the first digital audio signal is toggling between the logic low level and the logic high level to generate the control signal.

13. The sound processing device as claimed in claim 10, wherein the second analog-to-digital converter encodes the third digital audio signal by adding a DC offset value to the second digital audio signal.

14. The sound processing device as claimed in claim 10, wherein the second analog-to-digital converter encodes the third digital audio signal by multiplying the second digital audio signal by a multiplier.

15. The sound processing device as claimed in claim 10, wherein the second analog-to-digital converter encodes the third digital audio signal by delaying the second digital audio signal by a delay period.

16. A method for analog-to-digital conversion, wherein an analog-to-digital converter comprises a toggle detection module, a pre-amplifier, a 1-bit ΔΣ modulator, and a signal coding module, comprising:
receiving a mode signal, a channel selection signal, and a clock signal;
determining whether the channel selection signal is toggling between a logic low level and a logic high level with a toggle detection module to generate a first control signal;
receiving a first audio signal from a microphone sensor;
amplifying the first audio signal with the pre-amplifier to obtain a second audio signal;
converting the second audio signal from analog to digital with a 1-bit ΔΣ modulator to obtain a third audio signal; and
if the mode signal indicates an encoding mode and the channel selection signal is determined to be toggling, encoding a fourth audio signal according to the third audio signal with the signal coding module, outputting data bits of the fourth audio signal when the clock signal oscillates to the logic low level, and outputting data bits of the channel selection signal when the clock signal oscillates to the logic high level.

17. The method as claimed in claim 16, wherein the method further comprises:
if the mode signal does not indicate the encoding mode and the channel selection signal stays at the logic low level, outputting data bits of the third audio signal when the clock signal oscillates to the logic low level, and switching the output terminal of the analog-to-digital converter to a high-impedance state when the clock signal oscillates to the logic high level.

18. The method as claimed in claim 17, wherein the method further comprises:
if the mode signal does not indicate the encoding mode and the channel selection signal stays at the logic high level, outputting data bits of the third audio signal when the clock signal oscillates to the logic high level, and switching the output terminal of the analog-to-digital converter to the high-impedance state when the clock signal oscillates to the logic low level.

19. The method as claimed in claim 16, wherein the method further comprises:
if the mode signal indicates the encoding mode and the channel selection signal stays at the logic low level, outputting data bits of the third audio signal when the clock signal oscillates to the logic low level, and outputting inverted data bits of the third audio signal when the clock signal oscillates to the logic high level.

20. The method as claimed in claim 19, wherein the method further comprises:
if the mode signal indicates the encoding mode and the channel selection signal stays at the logic high level, outputting data bits of the third audio signal when the clock signal oscillates to the logic high level, and outputting inverted data bits of the third audio signal when the clock signal oscillates to the logic low level.

* * * * *